(12) United States Patent
Chen et al.

(10) Patent No.: US 9,560,786 B2
(45) Date of Patent: Jan. 31, 2017

(54) SLIDE RAIL ASSEMBLY AND SLIDE RAIL ASSEMBLY PAIR

(71) Applicant: EATON MANUFACTURING LP, GLASGOW, SUCCURSALE DE MORGES, Morges (CH)

(72) Inventors: Shuiyan Chen, Shenzhen (CN); Xin Su, Shenzhen (CN); Steven Chen, Shenzhen (CN)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 14/898,624

(22) PCT Filed: May 13, 2014

(86) PCT No.: PCT/CN2014/077349
§ 371 (c)(1),
(2) Date: Dec. 15, 2015

(87) PCT Pub. No.: WO2014/201921
PCT Pub. Date: Dec. 24, 2014

(65) Prior Publication Data
US 2016/0135325 A1 May 12, 2016

(30) Foreign Application Priority Data
Jun. 18, 2013 (CN) .......................... 2013 1 0240839

(51) Int. Cl.
*A47B 88/00* (2006.01)
*H05K 7/18* (2006.01)
(Continued)

(52) U.S. Cl.
CPC ............... *H05K 7/183* (2013.01); *A47B 88/04* (2013.01); *A47B 96/067* (2013.01); *A47B 96/07* (2013.01); *H05K 7/1489* (2013.01)

(58) Field of Classification Search
CPC .................................................... A47B 88/047
(Continued)

(56) References Cited

U.S. PATENT DOCUMENTS

| 1,301,495 A * | 4/1919 | Otte ....................... A47B 88/16 |
| | | 312/334.8 |
| 6,739,682 B2 * | 5/2004 | Shih ..................... A47B 88/044 |
| | | 312/223.1 |

(Continued)

FOREIGN PATENT DOCUMENTS

| CN | 2642136 | 9/2004 |
| CN | 1893796 | 1/2007 |

(Continued)

OTHER PUBLICATIONS

International Search Report Corresponding to International Application No. PCT/CN2014/077349; Date of Mailing: Aug. 22, 2014; 2 Pages.

*Primary Examiner* — Matthew Ing
(74) *Attorney, Agent, or Firm* — Myers Bigel, P.A.

(57) ABSTRACT

A slide rail assembly comprising: a first slide rail (10, 10') comprising a first, elongated web plate (11, 11'), a front surface facing toward a carried item (80) in use and a back surface facing away from the carried item in use; a second slide rail (20, 20') nested within the first slide rail and being movable relative to the first slide rail in length direction. The upper edge of the first web plate is provided with a first, L-shaped upper folded panel (12, 12') extending at an angle of 90 degrees with regard to the back surface of the first web plate, the lower edge thereof is provided with a horizontal supporting panel (13, 13') for supporting the item which is bended at an angle of 90 degrees with regard to the front surface of the first web plate, and the first web plate is also provided with at least one first, L-shaped lower folded panel (14, 14') opposite to the first upper folded panel and extend- (Continued)

ing at an angle of 90 degrees with regard to the back surface of the first web plate, with the first upper folded panel and the at least one first lower folded panel collectively constituting a slide chute for supporting and guiding the second slide rail sliding therein.

9 Claims, 10 Drawing Sheets

(51) Int. Cl.
    *H05K 7/14*     (2006.01)
    *A47B 88/04*     (2006.01)
    *A47B 96/06*     (2006.01)
    *A47B 96/07*     (2006.01)

(58) Field of Classification Search
    USPC ............ 312/333, 334.1, 334.4, 334.7, 334.8, 312/334.5, 334.44, 334.46
    See application file for complete search history.

(56) References Cited

U.S. PATENT DOCUMENTS

| | | | | |
|---|---|---|---|---|
| 6,805,418 | B2* | 10/2004 | Milligan | A47B 88/08 312/333 |
| 6,938,967 | B2* | 9/2005 | Dubon | H05K 7/1421 312/330.1 |
| 2008/0036347 | A1* | 2/2008 | Liang | A47B 88/04 312/334.5 |

FOREIGN PATENT DOCUMENTS

| | | |
|---|---|---|
| CN | 101594762 | 12/2009 |
| CN | 102740652 | 10/2012 |

* cited by examiner

SLIDE RAIL ASSEMBLY AND SLIDE RAIL ASSEMBLY PAIR

RELATED APPLICATIONS

The present application is a 35 U.S.C. §371 national phase application of PCT International Application No. PCT/CN2014/077349, having an international filing date of May 13, 2014, claiming priority to Chinese Patent Application No. 201310240839.8, filed Jun. 18, 2013. The disclosures of each application are incorporated herein by reference in their entireties. The above PCT International Application was published in the Chinese language as International Publication No. WO 2014/201921.

TECHNICAL FIELD

The present invention relates to a slide rail assembly and a slide rail assembly pair and, in particular, to a slide rail assembly and slide rail assembly pair for carrying UPS (uninterruptible power supply).

BACKGROUND

Slide rail is a mechanic device that is widely employed to carry an item, such as a drawer, a server or a UPS, to be slid relative to other structures. In the simplest way, the slide rail is composed of an inner rail and an outer rail, wherein the inner and outer rails are fixed onto two devices to be slid relative to each other, respectively. For example, the inner rail can be fixed on a UPS while the outer rail is fixed on a cabinet, and the inner rail is nested within the outer rail such that the UPS is mounted on the cabinet by means of the outer rail. In use, pushing a UPS will lead to the sliding of the inner rail fixed on the UPS relative to the outer rail under the guidance of the outer rail, thus causing the sliding of the UPS relative to the cabinet. Usually a UPS is pushed into or pulled from the cabinet.

Depending on specific applications, slide rail assembly can be improved in a more complicated way. For example, a slide rail assembly used for drawers which need to be pushed in and pulled out frequently may be provided with roller wheels, roller balls or even gear wheels between the inner rail and the outer rail to reduce the friction resistance between the inner and outer rails, so as to acquire a more smooth and stable operation. In addition, a damping may be provided between the inner and outer rails in order to prevent the damage to the slide rail assembly or other structures caused by an excessive applied force during operation. As to a slide rail assembly used for devices that need not to be operated frequently, such as a slide rail assembly used for installing a UPS on a cabinet, the smoothness of operation between the inner and outer rails is not so important in comparison to a slide rail assembly for drawers, and therefore no slide-aiding means is arranged between the inner and outer rails in normal cases. Moreover, for the purpose of improving the security of a slide rail assembly during use, a position limiting means or a positioning mechanism may be provided on the slide rail assembly.

Accordingly, the existing slide due to their simple structures could be neither satisfied for the requirements of smooth operation nor safety during use, or due to various additional mechanisms on the slide rail assembly for smooth and safe operation, leads to complex structures and high costs.

SUMMARY OF THE INVENTION

The technical problem to be addressed by the present invention lies in providing a slide rail assembly and a slide rail assembly pair which not only have good operability and security during use, but also have a simple structure.

In one aspect, there is provided a slide rail assembly, comprising: a first slide rail including a first, elongated web plate which has a front surface facing toward the carried item and a back surface facing away from the carried item in use; a second slide rail nested within the first slide rail and being movable relative to the first slide rail in length direction. The upper edge of the first web plate is provided with a first, L-shaped upper folded panel extending at an angle of 90 degrees with regard to the back surface of the first web plate, the lower edge of the first web plate is provided with a horizontal supporting panel used for supporting the item and bended at an angle of 90 degrees with regard to the front surface of the first web plate, and the first web plate is further provided with at least one first, L-shaped lower folded panel opposite to the first upper folded panel and extending at an angle of 90 degrees with regard to the back surface of the first web plate, with the first upper folded panel and said at least one first lower folded panel collectively constituting a slide chute for supporting and guiding the second slide rail sliding therein. Each of the first slide rail and the second slide rail of the slide rail assembly is punched out from an integral sheet, and thus has a simple structure and a high strength of structure, and is easy to manufacture, so that the production efficiency will be greatly improved and the cost will be reduced.

Preferably, the horizontal portion of the first lower folded panel extends from the first web plate at the same horizontal plane as that of the supporting panel.

Preferably, the second slide rail includes a second, elongated web plate, and the front surface of the second web plate is provided with a recess extending in the length direction of the second web plate. Optionally, the first web plate is also provided with a first protruding panel extending toward its back surface into the recess, the second slide rail has a first end surface and a second end surface, and the recess comprises a third end surface and a fourth end surface which are separated from the first end surface and the second end surface at given distances respectively, with the third end surface and the fourth end surface constituting stop means for stopping the movement of the first protruding panel in the length direction. The arrangement of the recess not only effectively increases the strength of the slide rail, but also tactfully forms a stopping and guiding means for the relative sliding between the first slide rail and the second slide rail.

Preferably, the upper edge of the second web plate is provided with a second, L-shaped upper folded panel extending at an angle of 90 degrees with regard to the back surface of the second web plate, and the lower edge of the second web plate is provided with a second, L-shaped lower folded panel extending at an angle of 90 degrees with regard to the back surface of the second web plate, the second upper folded panel and the second lower folded panel being arranged in opposition to each other. Optionally, the slide rail assembly further comprises a third slide rail nested within the second slide rail, with the second upper folded panel and the second lower folded panel constituting a slide chute for supporting and guiding the third slide rail sliding in the second slide rail.

Preferably, each of the second upper folded plate and the second lower folded plate of the third slide rail consists of a first section in proximity to the third slide rail and a second section in proximity to the first slide rail, with the distance between the outer edge of the first section of the second upper folded panel and the outer edge of the first section of the second lower folded panel being shorter than that between the outer edge of the second section of the second upper folded panel and the outer edge of the second section of the second lower folded panel, so that a step is formed at the outer edge of the second upper folded panel and/or the outer edge of the second lower folded panel.

Preferably, the end portion of the third slide rail in proximity to the second slide rail is provided with a protruding panel extending away from the back surface of the second slide rail, and the upper and lower edges of the protruding panel abut against the outer edges of the second upper and lower folded panels of the second slide rail, with the protruding panel cooperating with the step on the outer edge of the second upper folded panel and/or second lower folded panel to form a stop means when the second slide rail and the third slide rail move away from each other.

Optionally, the third slide rail includes a third web plate on which at least one elastic panel is punched out. The side surface of the outer end portion of the elastic panel towards the second web plate of the second slide rail is provided with a first protrusion, and a recess or through-hole for receiving the first protrusion is provided at a position on the second web plate of the second slide rail which corresponds to the first protrusion in the retracted condition of the slide rail assembly.

Optionally, on the third web plate of the third slide rail is provided a second protrusion which is located in the first slide rail and forms a tight fit with the inner side surface of the first slide rail in the retracted condition of the slide rail assembly.

In another aspect, the present invention relates to a slide rail assembly pair, comprising a first slide rail assembly and a second slide rail assembly at least one of which is the slide rail assembly comprising the abovementioned features.

Preferably, the first slide rail assembly and the second slide rail assembly are in mirror symmetry, wherein the second slide rail of the first slide rail assembly can be replaced with the second slide rail of the second slide rail assembly, and the third slide rail of the first slide rail assembly can be replace with the third slide rail of the second slide rail assembly.

BRIEF DESCRIPTION OF DRAWINGS

The above-mentioned aspects and features of the present invention as well as other technical features of the invention will be described herein in detail in association with accompanying drawings, in which.

In these figures, the same reference numerals represent identical or corresponding features, and the reference numerals used herein are listed as follows.

10, 10' first slide rail
11, 11' first web plate
12, 12' first upper folded panel
13, 13' supporting panel
14, 14' first lower folded panel
15, 15' protruding tache
16, 16' first protruding panel
17, 17' tab on the first slide rail
18, 18' mounting hole on the first slide rail
20, 20' second slide rail
21, 21' second web plate
22, 22' recess
221, 221' upper side surface of the recess
222, 222' lower side surface of the recess
223, 223' third end surface
224, 224' fourth end surface
23, 23' first end surface
24, 24' second end surface
25, 25' second upper folded panel
251, 251' first section of the second upper folded panel
252, 252' second section of the second upper folded panel
27, 27' second lower folded panel
271, 271' first section of the second lower folded panel
272, 272' second section of the second lower folded panel
28, 28' through hole
30, 30' third slide rail 31, 31' third web plate
32, 32' elastic panel
321, 321' first protrusion
33, 33' second protrusion
34, 34' second protruding panel
36, 36' tab on the third slide rail
37, 37' mounting hole on the third slide rail
60 second slide rail assembly
60' first slide rail assembly
80 UPS
90 cabinet
91 post
92 mounting hole

DETAILED DESCRIPTION

The specific embodiments and examples according to the present invention will be described in detail as follows, in order to assist the skilled in the art in understanding the abovementioned aspects and features as well as other aspects and features of the invention more clearly. It is understood that the skilled in the art is able to make various modifications and substitutions to the specific embodiments and examples described herein without departing the scope of the invention, which modifications and substitutions all fall into the protection scope of the present invention.

Figure 1:
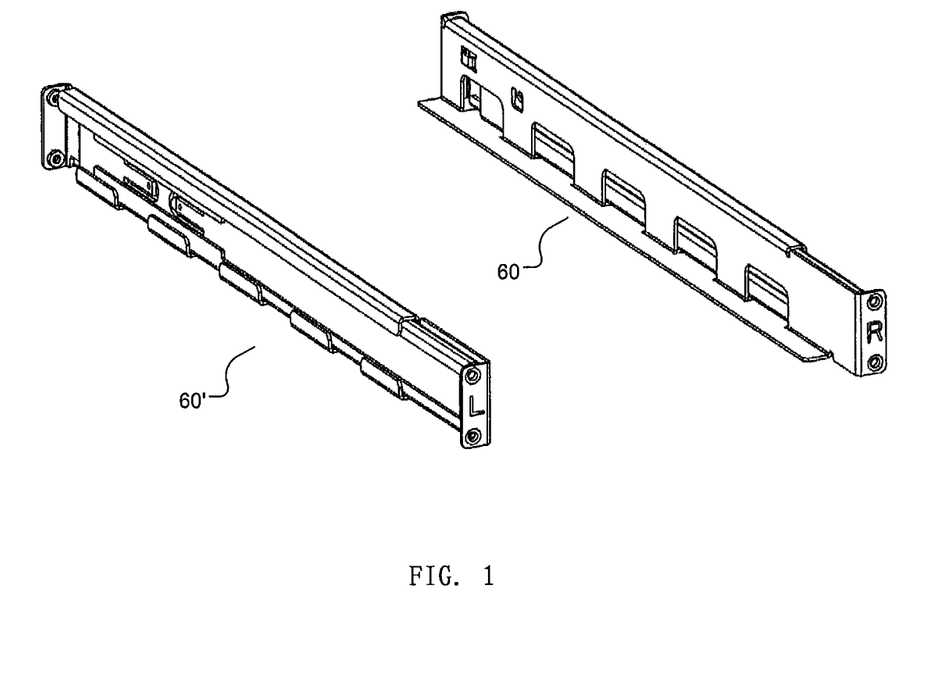
FIG. 1 is a schematic view of an exemplary first slide rail assembly 60' and a second slide rail assembly 60 according to the invention in completely retracted condition.
Figure 2:
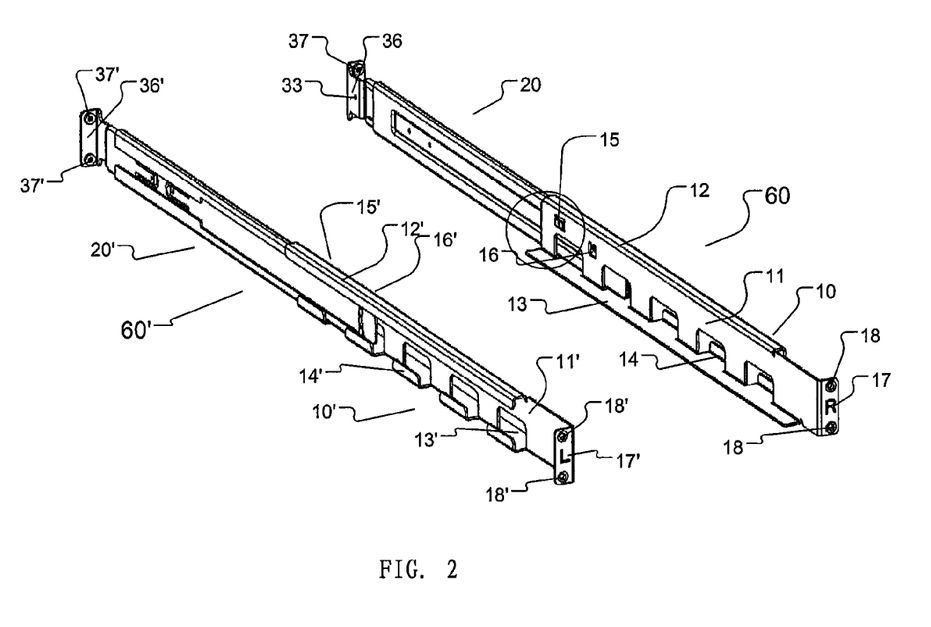
FIG. 2 is a schematic view of the first slide rail assembly 60' and the second slide rail assembly 60 of FIG. 1, wherein the first slide rails 10 (10') and the second slide rails 20 (20') are in deployed condition, and the second slide rails 20 (20') and the third slide rails 30 (30') are in retracted condition.
Figure 3:
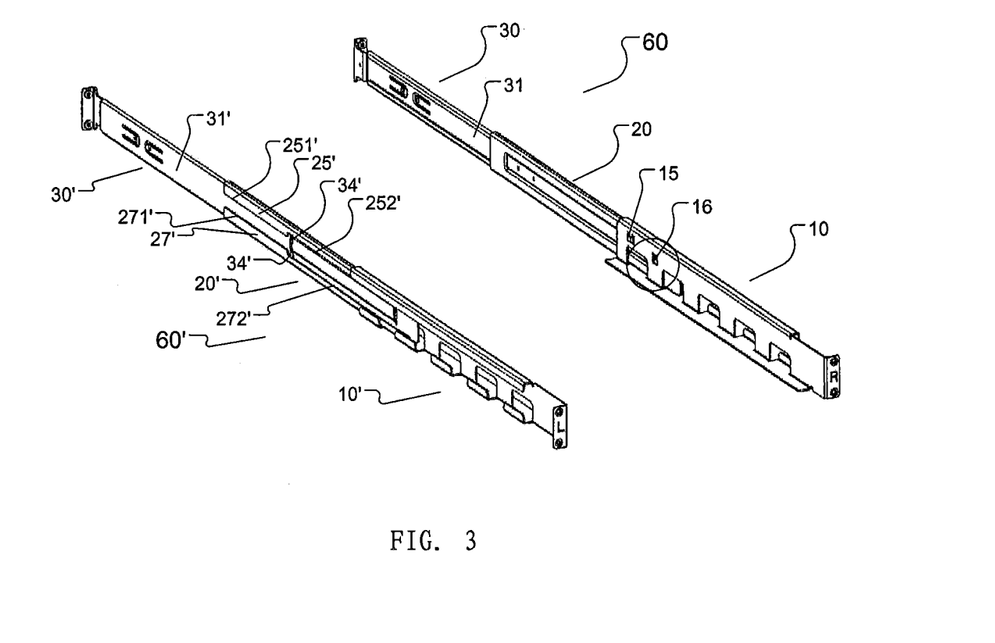
FIG. 3 is a schematic view of the first slide rail assembly 60' and the second slide rail assembly 60 of FIG. 1 in completely deployed condition, wherein the first slide rails 10 (10'), second slide rails 20 (20') and the third slide rails 30 (30') all are in deployed condition.
Figure 3A:
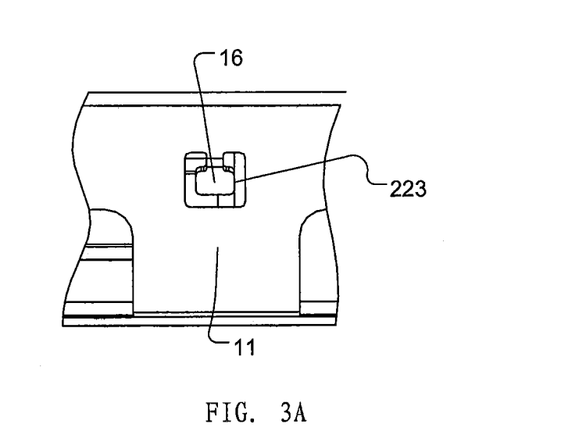
FIG. 3A is a partially enlarged view of the circled portion of FIG. 3, mainly showing a first protruding panel 16 on the first slide rail 10.
Figure 8:
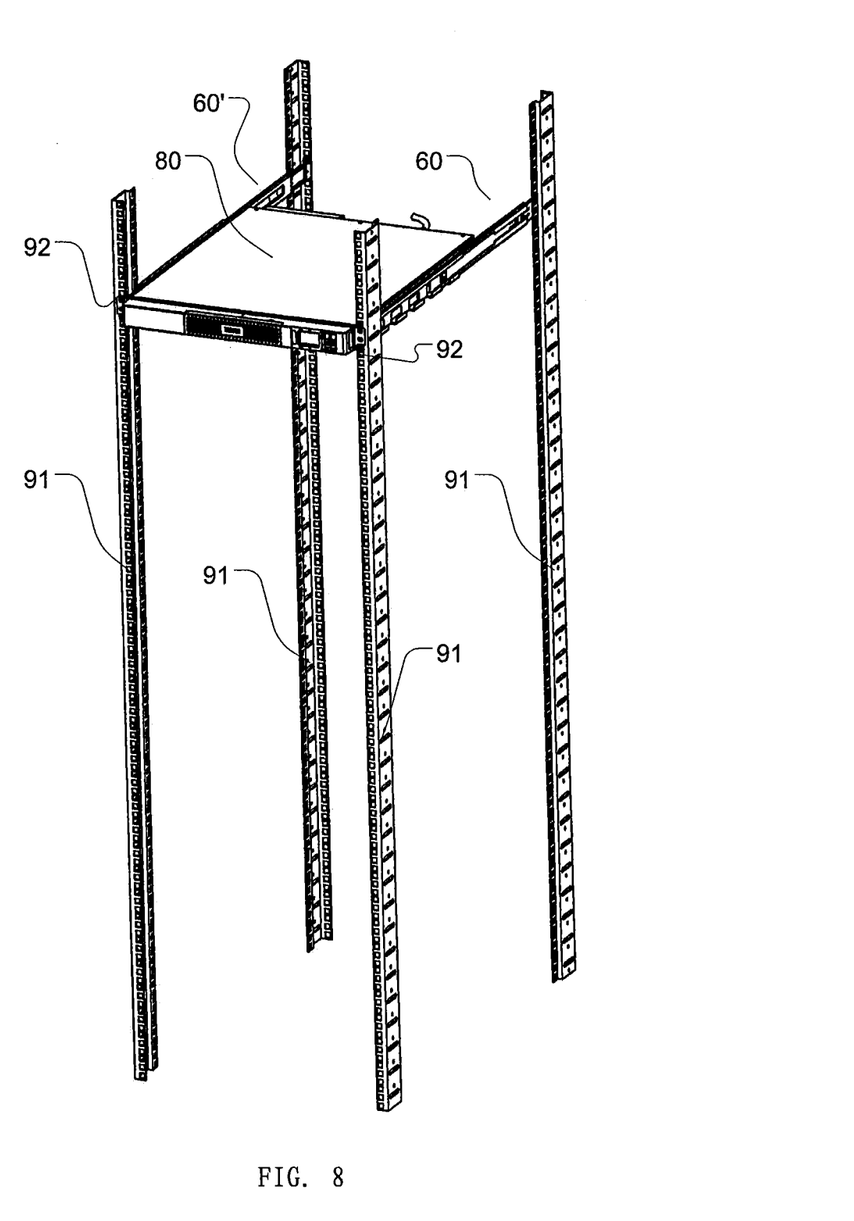
FIG. 8 shows the portion of posts 91 of the cabinet 90 in FIG. 7, wherein on the posts 91 is installed a UPS 80 by means of a exemplary slide rail assembly pair according to the invention.

FIGS. 1, 2 and 3 illustrates an embodiment of slide rail assembly pair according to the present invention which can be used to installing a UPS onto a cabinet. The slide rail assembly pair comprises a first slide rail assembly 60' and a second slide rail assembly 60. Each slide rail assembly has three-section slide rails, that is, the first slide rail assembly 60' and the second slide rail assembly 60 each comprise a first slide rail, a second slide rail and a third slide rail. During the use, as shown in FIG. 8, the leading end of the first slide rail 10 of the second slide rail assembly 60 is fixed on the right one of posts 91 at the front side of the cabinet, the leading end of the second slide rail 20 is connected to the trailing end of the first slide rail 10, and the leading end of the third slide rail 30 is connected to the trailing end of the second slide rail 20, while the trailing end of the third slide rail 30 is fixed on the right one of the posts 91 at the rear side of the cabinet 90, so as to fix the second slide rail assembly 60 at the right side of the cabinet 90. The first slide rail assembly 60' is fixed at the left side of the cabinet in the same way. In use, the first slide rail assembly 60' is located at the left side of the UPS as shown in FIG. 8, while the second slide rail assembly 60 is located at the right side of the UPS.

It is understood that the first slide rail assembly 60' and the second slide rail assembly 60 can have identical pr different configurations. In the embodiment shown in the drawings, the first slide rail assembly 60' and the second slide rail assembly 60 are in mirror symmetry, wherein the first slide rail 10 and the first slide rail 10' are different from each other and thus are not replaceable with each other. However, the second slide rail 20' and the second slide rail 20 may be the same in terms of their profiles and thus are replaceable with each other, and so it goes with the third slide rail 30' and the third slide rail 30.

Although the drawings illustrate three-section slide rail assemblies, each of the slide rail assembly according to the present invention can have any number of sections, such as two-section slide rails, four-section slide rails or five-section slide rails etc. In the shown embodiment, the slide rail assemblies are used for installing the UPS onto the cabinet. Nevertheless, it is understood that the slide rail assemblies can be used for many applications, such as for installing a server or even a drawer.

In the shown embodiments, the first slide rail 10 (10'), the second slide rail 20 (20') and the third slide rail 30 (30') can slide relative to the others along length direction, in order to change the overall lengths of the first slide rail assembly 60' and the second slide rail assembly 60. FIG. 1 shows a schematic view of exemplary first and second slide rails assemblies 60', 60 according to the invention in completely retracted condition, in this case the second slide rail 20 (20') and the third slide rail 30 (30') are substantially completely retracted into the first slide rail 10 (10'). In FIG. 2, the first slide rail 10 (10') and the second slide rail 20 (20') of the first and second slide rail assemblies 60', 60 are in deployed condition, and the second slide rail 20 (20') and the third slide rail 30 (30') are in retracted condition. In FIG. 3, all the slide rails of the first slide rail assembly 60' and the second slide rail assembly 60 are completely deployed and thus are in completely deployed condition in which the slide rail assemblies reach their maximum set length.

The specific embodiments and examples of the slide rail assembly and slide rail assembly pair according to the present invention will be described below in detail with reference to the accompanying drawings. As mentioned above, in the embodiments shown in the drawings, the first slide rail assembly 60' and the second slide rail assembly 60 of the slide rail assembly pair are in mirror symmetry. For the sake of conciseness and clarity, only the second slide rail assembly 60 will be described in detail hereinafter.

Figure 9:
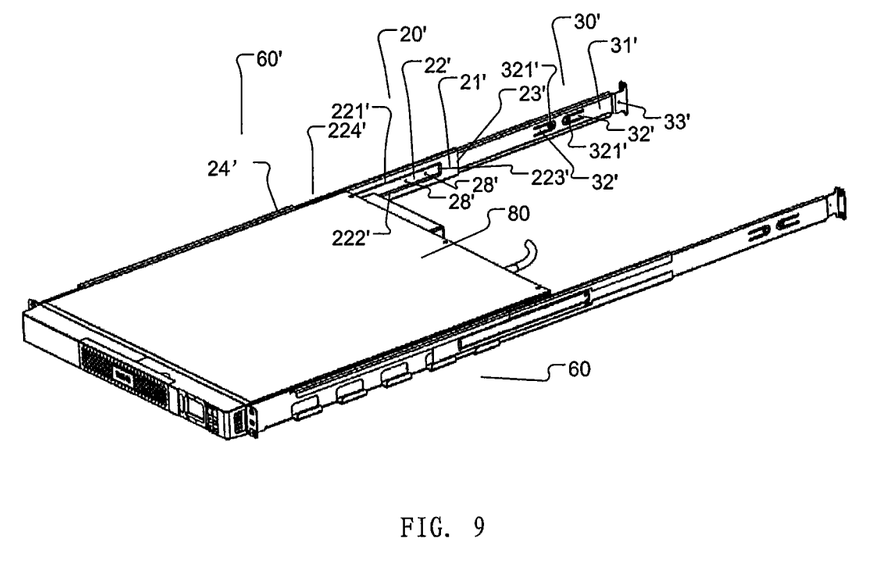
FIG. 9 is a schematic view showing the mounting relationship between a slide rail assembly pair and a UPS 80.

In FIGS. 1, 2 and 3, especially in FIG. 2, the first slide rail 10 of the second slide rail assembly 60 comprises a first, elongated web plate 11 which has a front surface facing toward the UPS during the use and a back surface facing away from the UPS (as shown in FIG. 9). The upper edge of the first web plate 11 is provided with a first, L-shaped upper folded panel 12 which extends at an angle of 90 degrees with regard to the back surface of the first web plate 11, and the lower edge of the first web plate 11 is provided with a supporting panel 13 extending at an angle of 90 degrees with regard to the front surface of the first web plate 11. Further, the first web plate 11 is punched with five first, L-shaped lower folded panels 14 opposite to the first upper folded panel 12 and extending at an angle of 90 degrees with regard to the back surface of the first web plate 11. In this case, each of the first upper folded panel 12 and the first lower folded panel 14 includes a horizontal portion extending substantially perpendicularly with the first web plate 11 and a vertical portion extending substantially parallel with the first web plate 11. The vertical portions of the first upper folded panel 12 and the first lower folded panel 14 are arranged in opposition to each other and are substantially located in same vertical plane, and the supporting panel 13 and the horizontal portion of the first lower folded panel 14 are substantially located in same horizontal plane. The first upper folded panel 12 and the first lower folded panel 14 collectively constitute a slide chute for supporting and guiding second slide rail 20 sliding therein, while the UPS 80 is placed on the supporting panels 13 and is supported by them (as shown in FIG. 9).

The skilled in the art will appreciate that it is also possible for the said first web plate 11 to be provided with only one first lower folded panel 14 having suitable length in the length direction, or with other number of, such as two, three or more, first lower folded panels 14. Furthermore, it is also possible for the first lower folded panel 14 to be arranged at a different horizontal plane from that of the supporting panel. For example, the horizontal plane in which the first lower folded panel is located is higher than that of the supporting panel 13.

The leading end of the first web plate 11 is provided with a tab 17 extending at an angle of 90 degrees with regard to its back surface. On the tab 17 are arranged mounting holes 18 used for being aligned with the mounting holes 92 on the post 91 of the cabinet 90 and for allowing the tab 17 and the post 91 to be fixed to each other by a fasten means, such as a bolt, when assembling (as shown in FIG. 8).

The trailing end of the first web plate 11 has a straightly truncated configuration, i.e. the end surface of the first web plate 11 is substantially perpendicular with its length direction. The second slide rail 20 is inserted from the trailing end into the slide chute consisting of the first upper folded panel 12 and the second lower folded panel 14. It is envisaged that the trailing end of the first web plate 11 can also be of an obliquely truncated configuration, i.e. the end surface of the first web plate 11 is at angle with its length direction, in order to facilitate the insertion of the second slide rail 20 into the slide chute during assembling.

Figure 2A:
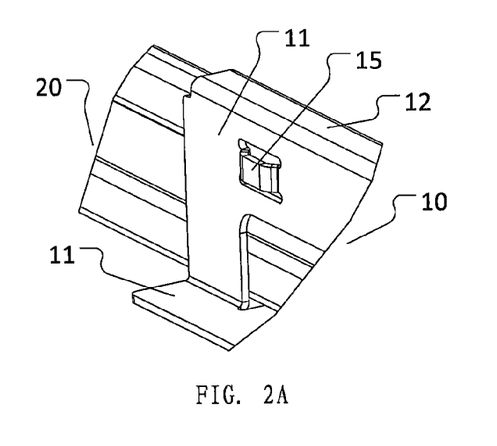
FIG. 2A is a partially enlarged view of the circled portion of FIG. 2, mainly showing a protruding tache 15 on the first slide rail 10.

As shown in FIG. 2A, the first web plate 11 is punched toward the front surface with a protruding tache 15. The protruding tache 15 is used to fix the UPS placed on the supporting panel 13 of the first slide rail 10. At a position on the UPS corresponding to the protruding tache 15 may be provided a pin (not shown) which can be inserted into the protruding tache 15 when placing the UPS on the supporting panel 13 of the first slide rail, so as to allow the UPS to be fixed onto the first slide rail 10. Of course, other structures to be mated with the protruding tache 15 to allow them to be fixed to each other may also be provided on the UPS. For example, a protruding tache can also be provided at a corresponding position on the UPS. When assembling, the protruding tache on the UPS is aligned with the protruding tache 15 on the first web plate 11, and then a latch pin is inserted through the two aligned protruding taches, thus fixing them to each other.

Hereinafter the second slide rail 20 of the second slide rail assembly 60 according to the present invention will be described in association with FIGS. 4 and 5. The leading end of the second slide rail 20 is inserted from the trailing end of the first slide rail 10 into the slide chute consisting of the first upper folded panel 12 and the first lower folded panel 14, and the trailing end of the second slide rail 20 is connected to the third slide rail 30 nested within the second slide rail 20. It can be seen from FIGS. 4 and 5 that the second slide rail 20 comprises a second, elongated web plate 21, wherein the upper edge of the second web plate 21 is provided with a second, L-shaped upper folded panel 25 extending at an angle of 90 degrees with regard to the back surface of the second web plate 21, and the lower edge of the second web plate 21 is provided with a second, L-shaped lower folded panel 27 extending at an angle of 90 degrees with regard to the back surface of the second web plate 21, with the second upper folded panel 25 and the second lower folded panel 27 being arranged in opposition to each other. In this case, the second upper folded panel 25 has a substantially horizontal portion extending from the second web plate 21 and a vertical portion extending downwards from the horizontal portion, while the second lower folded panel 27 has a substantially horizontal portion extending from the second web plate 21 and a vertical portion extending upwards from the horizontal portion, with the vertical portions of the second upper folded panel 25 and the second lower folded panel 27 are substantially located in same vertical plane. The second upper folded panel 25 and the second lower folded panel 27 constitute a slide chute for supporting and guiding the second third slide rail 30 sliding therein.

Figure 4:
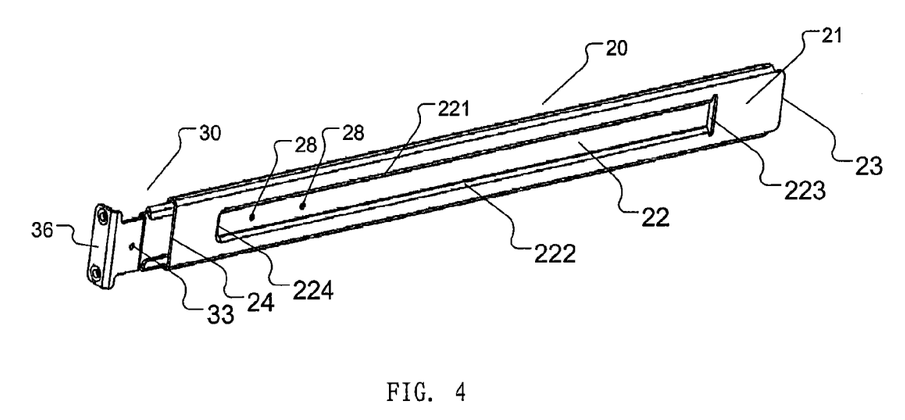
FIG. 4 is a schematic view of the second slide rail assembly 60 shown in FIG. 1 with the first slide rail 10 being removed, wherein the second slide rail 20 and the third slide rail 30 are in retracted condition, and the front side structure of the second slide rail 20 is shown.

It can be seen from FIG. 4 that the front surface of the second web plate 21 is punched with a recess 22 extending in the length direction of the second web plate 21, and thus a protrusion extending in the length direction of the second web plate 21 is formed on the back surface of the second web plate 21. The recess 22 has upper and lower side surfaces 221, 222 extending substantially straightly in the length direction. Meanwhile, the second slide rail 20 has a first end surface 23 in proximity to the first slide rail 10 and a second end surface 24 in proximity to the third slide rail 30, and the recess 22 in the second web plate 21 of the second slide rail 20 comprises a third end surface 223 and a fourth end surface 224 which are in proximity to the first end surface 23 and the second end surface 24 respectively. There are given distances between the first end surface 23 and the third end surface 223 and between the second end surface 24 and the fourth end surface 224.

The said recess may be provided with stops for stopping the second slide rail 20 in the first slide rail. It can be seen from FIG. 3 that on the first web plate 11 of the first slide rail 10 there is punched out a first protruding panel 16 protruding toward the back surface of the first web plate 11 and extending from the back surface of the first web plate 11 into the recess 22. When the second slide rail 20 slides within the first slide rail 10, the third end surface 223 and the fourth end surface 224 form stop means for stopping the movement of the first protruding panel 16 in the length direction, preventing the over insertion of the second slide rail 20 when being retracted into the first slide rail 10 and the pulling off of the second slide rail 20 when being deployed from the first slide rail 10. Meanwhile, the distances between the first end surface 23 and the third end surface 223 and between the second end surface 24 and the fourth end surface 224 determines the length of the overlapping portion of the second slide rail 20 and the first slide rail 10.

Next, the specific structure of the third slide rail 30 will be introduced in association with the drawings. It can be seen from FIG. 5 that the third slide rail 30 comprises a elongated web plate 31 nested within the second slide rail 20. In order to cooperate with the configuration of the slide chute consisting of the second upper folded panel 25 and the second lower folded panel 27 and supporting and guiding the third slide rail 30 sliding therein, from the upper and lower edges of the web plate 31 of the third slide rail extends respective upper and lower folded portions (not shown in the figures), respectively. A skilled person in the art understands that it is also possible for the upper edge and the lower edge of the web plate 31 of the third slide rail without such a upper folded portion and a lower folded portion, so that the third slide rail becomes a pure flat plate. The leading end of the third slide rail 30 is nested within the second slide rail 20, while the trailing end thereof is provided with a tab 36 extending from the back surface of the web plate 31 and having mounting holes 37 (see FIG. 2) on it. In use, the mounting holes 37 will be aligned with mounting holes on the posts 91 of the cabinet 90 and will be fixed by a fasten means, such as a bolt.

Figure 5:
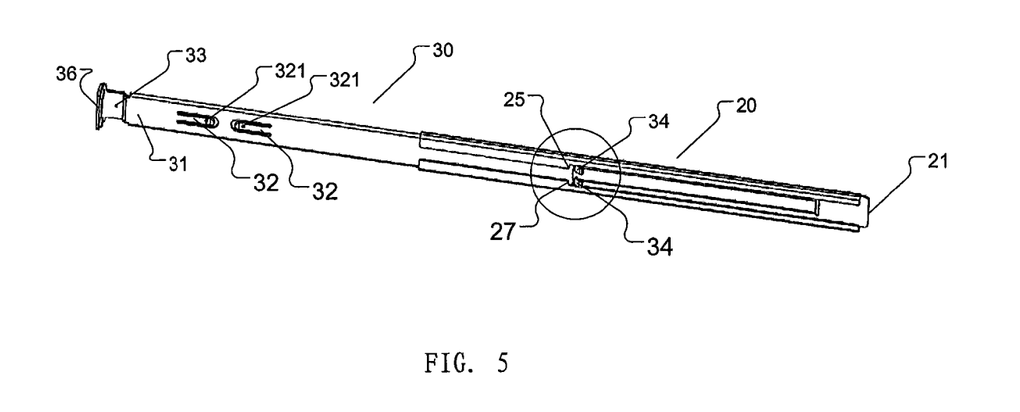
FIG. 5 is a schematic view of the second slide rail assembly 60 shown in FIG. 1 with the first slide rail 10 being removed, wherein the second slide rail 20 and the third slide rail 30 are in deployed condition, and the back side structure of the second slide rail 20 and the third slide rail 30 are shown.

It can be seen from FIG. 5 that each of the outer edges of the second upper and lower folded panels 25, 27 on the web plate 21 of the second slide rail 20 is of a stepped shape. In this case, the outer edge of the second upper folded panel 25 comprises a first section 251 distal to the first slide rail 10 and a second section 252 proximal to the first slide rail, and the outer edge of the second lower folded panel 27 comprises a first section 271 distal to the first slide rail 10 and a second section 272 proximal to the first slide rail, with the relative distance between the first section 251 of the second upper folded panel 25 and the first section 271 of the second lower folded panel 27 being shorter than that between the second section 252 of the second upper folded panel 25 and the second section 272 of the second lower folded panel 27.

Figure 5A:
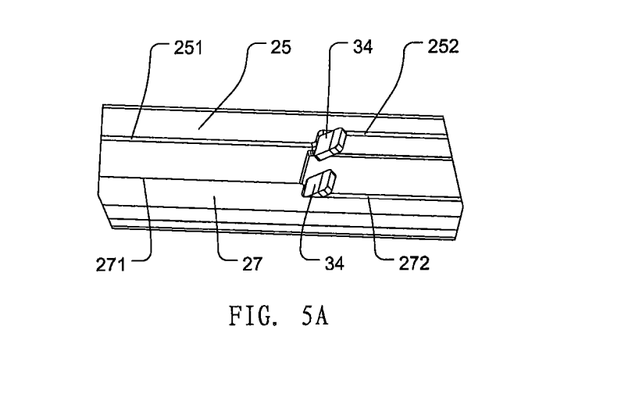
FIG. 5A is a partially enlarged view of the circled portion of FIG. 5, mainly showing a second protruding panel 34 on the end portion of the third slide rail 30.

The stepped outer edges of the second upper and lower folded panels 25, 27 can cooperate with the third slide rail to form a stopping mechanism. As shown in FIGS. 5 and 5A, the trailing end of the third slide rail 30, i.e. the end in proximity to the second slide rail 20, is provided with two second protruding panels 34 extending away from the back surface of the second slide rail 20. The upper edge of one of the second protruding panels 34 abuts against the second section 252 of the outer edge of the second upper folded panel of the second slide rail, and the lower edge of the other second protruding panel 34 abuts against the second section 272 of the outer edge of the second lower folded panel of the second slide rail, such that the second protruding panels 34 cooperate with the steps on the outer edges of the second upper and lower folded panels 25, 27 to form a stop means so as to prevent the second slide rail 20 and the third slide rail 30 being separated from each other due to over slide when the second slide rail 20 and the third slide rail 30 move away from each other to deploy the slide rail assembly. A skilled person in the art will envisage that it is also possible for the two second protruding panels 34 shown in the figures to be formed as a single integral part or to have other configurations, as long as they are able to cooperate with the steps on said outer edges to form a stop means.

Figure 5B:
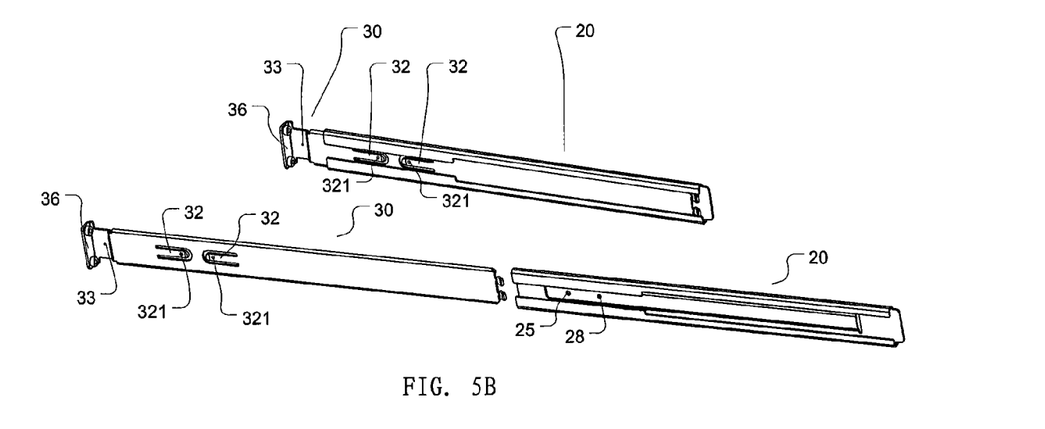
FIG. 5B is a schematic view showing the second slide rail 20 and the third slide rail 30 shown in FIG. 5 and the retracted condition of them, and mainly showing a through hole 28 on the second slide rail 20 and a first protrusion 321 on an elastic panel 32 of the third slide rail 30 as well as the cooperation relationship between them.

It can also be seen from FIG. 5 that on the web plate 31 of the third slide rail 30 there are punched out two elastic panels 32. The back surfaces of the outer end portions of the elastic panels 32, i.e. the side surfaces thereof towards the web plate 21 of the second slide rail 20, is provided with first protrusions 321. In the retracted condition of the second slide rail assembly, recesses or through-holes 28 (see FIGS. 5B and 6) for receiving the first protrusions 321 are provided at positions on the web plate 21 of the second slide rail 20 corresponding to the first protrusion 321. When deploying the slide rail assembly, a sufficient pull force must be exerted to overcome the interaction force between the first protrusions 321 and the through-holes 28, and thus to prevent the second slide rail 20 slides relative to the third slide rail 30 accidently or automatically. It is understood that the web plate 31 of the third slide rail 30 can also be provided with only one elastic panel 32, or with other number of, such as three or more, elastic panels 32.

Figure 6:
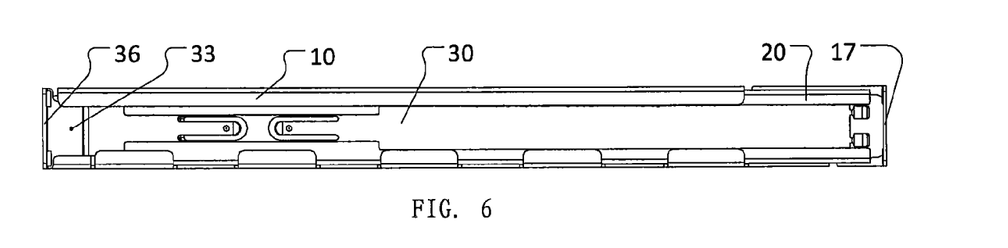
FIG. 6 is a schematic view of the second slide rail assembly 60 in completely retracted condition, mainly showing the cooperation relationship between a second protrusion 33 on the trailing end 36 of the third slide rail 30 therein and a web plate 11 of the first slide rail 10.
Figure 6A:
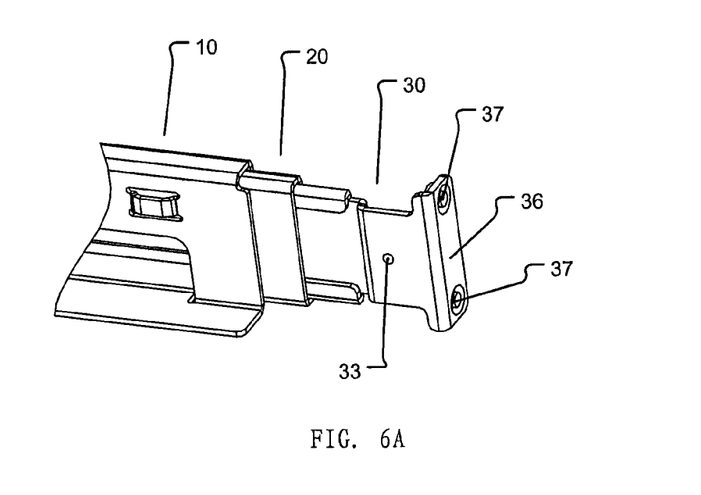
FIG. 6A is a partially enlarged view of the second slide rail assembly 60 of FIG. 6 viewed from its front side, with the second slide rail assembly 60 being in partially deployed condition, mainly showing the second protrusion 33 provided on the third slide rail.

It can also be seen from FIGS. 6 and 6A that on the web plate 31 of the third slide rail 30 is provided second protrusion 33 which is received in the first slide rail and forms a tight fit with the inner side surface of the first slide rail 10, in the retracted condition of the slide rail assembly.

Figure 7:
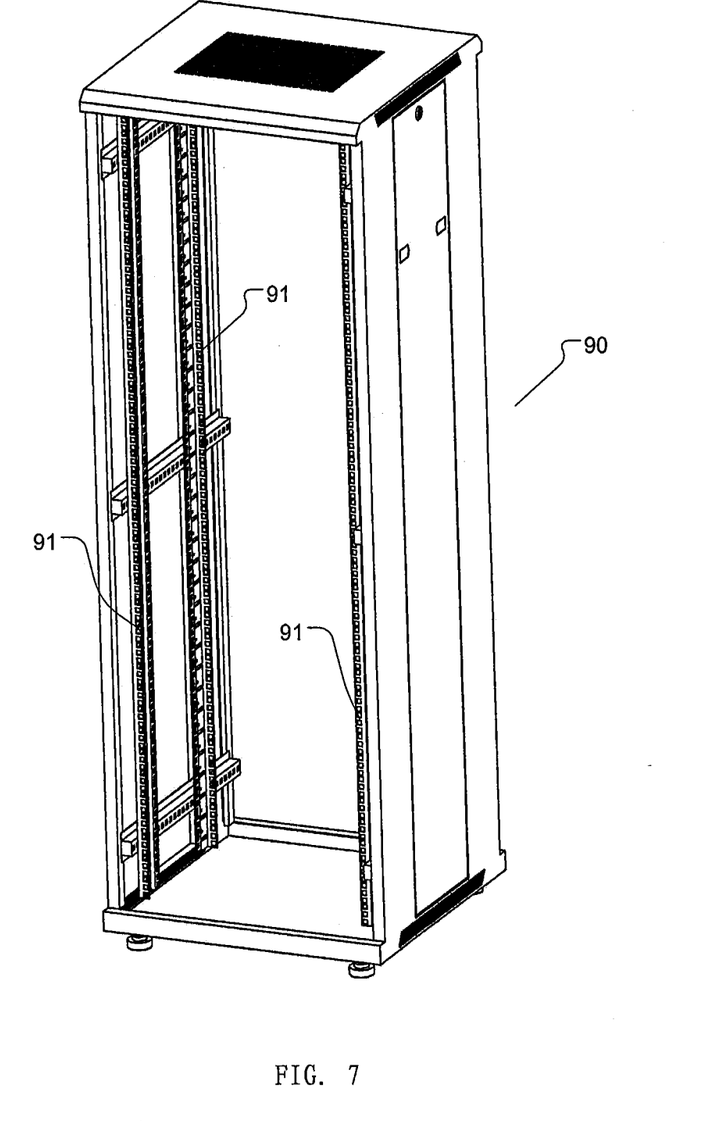
FIG. 7 shows an exemplary cabinet 90 employing a slide rail assembly pair of the invention.

FIG. 7 shows an exemplary cabinet 90 employing a slide rail assembly pair according to the present invention. A skilled person in the art will understand that it is also possible for the slide rail assembly according to the present invention to be applied to many other fields. The applications include, but are not limited to, the one where sliding relative to other devices or structures is intended, such as drawer or server. FIG. 7 shows a typical UPS cabinet which can be used for receiving and installing multiple UPSs therein. The cabinet 90 comprises four posts 91 arranged at the inner sides of the side walls of the cabinet 90 with any two of the four posts being in opposition to each other, and the posts 91 are used for installing the slide rail assembly pair according to the invention.

FIG. 8 shows the portion of posts 91 of the cabinet 90 in which the UPS 80 is installed. Each of the posts 91 is provided with a plurality of mounting holes 92 along its length direction. During the use, the mounting holes on the tabs of the leading end of the first slide rails 10, 10' and of the trailing end of the third slide rail 30, 30' are aligned with the mounting holes 92 of the posts 91 at a selected height, and the tabs are fixed to the posts by fasten means such as bolts. By this way the UPS 80 is supported and fixed on the slide rails, and thus installed onto the cabinet 90 at a suitable position. It is envisaged that multiple UPSs can be installed along the height direction of the cabinet 90 in this way. Since the mounting holes 92 on the post 91 is evenly distributed along the length direction of the post at the same intervals, the position where the slide rail and UPS are mounted is easy to determine, enabling simple and fast installation of the slide rail and UPS.

FIG. 9 shows the slide rail assembly pair and UPS of FIG. 8 in mounted condition. It can be seen from this drawing that the slide rail assembly pair comprises the first slide rail assembly 60' and second slide rail assembly 60 located at the left side and right side of the UPS 80 respectively, each of these assemblies is in completely deployed condition. The UPS is placed on the slide rail assembly pair, wherein the left and right portions of the bottom of the UPS 80 are supported by the supporting portions 18, 18' (see FIGS. 4 and 5) of the first slide rails 10', 10 respectively. A skilled person in the art will envisage that it is also possible for the UPS to be placed on the first slide rails 10, 10' without being fixed by other means, or to be further fixed by additional means. The additional means may be bolts, screws, adhesives and the like. It is also possible for the UPS to be fixed by providing a protrusion structure on the web plate 11 (see FIG. 5) of the slide rail and allowing the protrusion structure to form a interference fit with the UPS. Meanwhile, as introduced above, the protruding tache 15 on the web plate 11 of the first slide rail 10 may also be used to fixing the UPS onto the slide rail assembly.

As used herein, the orientational terms, such as upper, lower, back surface, front surface, front, back and the like, are only used for the purpose of description, other than for limitation to technical solutions per se. In the meantime, the terms like "first", "second" etc. are only used for distinguishing two or more different components, instead of suggesting the sequence relationship of these components. It is understood that these terms can be replaced with other expressions without departure from the spirits of the invention. Moreover, the protection scope of the invention shall be determined by the attached claims, and the embodiments described herein are only used by means of examples for illustrating the technical solutions or features of the invention. These embodiments are not intended to substitute the limitations of the claims. The protection scope of the present invention includes, but is not limited to, the technical solutions embodied by the abovementioned embodiments, as well as other unspecified embodiments without departure from the invention.

The invention claimed is:

1. A slide rail assembly comprising: a first slide rail having an end configured to be attached to a first mounting post proximate a first side of a cabinet and including a first elongated web plate which has a front surface facing toward a carried item and a back surface facing away from the carried item in use; a second slide rail nested within a slide chute of the first slide rail and comprising a second elongated web plate having a recess therein extending along the length of the second web plate, the second slide rail being movable relative to the first slide rail along a length of the first slide rail, wherein the first slide rail comprises a first L-shaped upper folded panel extending from an upper edge of the first web plate at an angle of about 90 degrees with regard to the back surface of the first web plate, a horizontal supporting panel for supporting the item extending from a lower edge of the first web plate at an angle of about 90 degrees with regard to the front surface of the first web plate, and at least one first L-shaped lower folded panel extending from the lower edge of the first web plate at an angle of about 90 degrees with regard to the back surface of the first web plate in a direction opposite that of the horizontal supporting panel, with the first upper folded panel and the at least one first lower folded panel form the slide chute for the second slide rail, wherein the second slide rail comprises a second L-shaped upper folded panel extending from an upper edge of the second web plate at angle of about 90 degrees with regard to the back surface of the second web plate and a second L-shaped lower folded panel extending from a lower edge of the second web plate at an angle of about 90 degrees with regard to the back surface of the second web plate and further comprising a third slide rail nested within the second slide rail, the second upper folded panel and the second lower folded panel forming a slide chute for supporting and guiding the third slide rail, the third side rail having an end configured to be attached to a second mounting post proximate a second side of the cabinet, wherein the third slide rail comprises a third elongated web plate having at least one elastic panel punched out, wherein a side surface of the outer end portion of the at least one elastic panel towards the second web plate of the second slide rail is provided with a first protrusion, wherein the second web plate has a recess or through-hole for receiving the first protrusion in a retracted condition of the slide rail assembly, and wherein the third web plate has a second protrusion which forms a tight fit with an inner side surface of the first slide rail in a retracted condition of the slide rail assembly.

2. The slide rail assembly according to claim 1, wherein the first lower folded panel extends from the first web plate at the same horizontal plane as the supporting panel.

3. The slide rail assembly according to claim 1, wherein the first web plate comprises a first protruding panel extending toward its back surface into the recess and configured to contact first and second ends of the recess to restrict movement of the second slide rail within the slide chute along the length of the first slide rail.

4. The slide rail according to claim 1, wherein each of the second upper folded panel and the second lower folded panel of the second slide rail comprises a first section in proximity to the third slide rail and a second section in proximity to the first slide rail, with the distance between an outer edge of the first section of the second upper folded panel and an outer edge of the first section of the second lower folded panel being less than a distance between an outer edge of the second section of the second upper folded panel and an outer edge of the second section of the second lower folded panel, so that a step is formed at an outer edge of the second upper folded panel or an outer edge of the second lower folded panel.

5. The slide rail assembly according to claim 4, wherein the third slide rail comprises a protruding panel extending away from the back surface of the second slide rail in proximity to the second slide rail, wherein upper and lower edges of the protruding panel abut against the outer edge of the second upper folded panel and the outer edge of the second lower folded panel of the second slide rail, with the protruding panel cooperating with the step on the outer edge of the second upper folded panel or of the second lower folded panel to form a stop when the second slide rail and the third slide rail move away from each other.

6. A cabinet having the slide rail assembly of claim 1 installed therein.

7. A slide rail assembly for supporting an object within a cabinet, the assembly comprising:
a first slide rail configured to be affixed at an end thereof to a first mounting post of to the cabinet proximate a first side of the cabinet, the first slide rail comprising a first elongate plate, a supporting panel extending from a lower edge of the first elongate plate on a first side of the elongate plate and configured to provide a shelf that supports the object and first and second L-shaped panels extending from the lower edge of first elongate plate and an upper edge of the first elongate plate, respectively, and forming a first slide chute;
a second slide rail slidably disposed in the first slide chute and comprising a second elongate plate having a recess therein extending along the length of the second elongate plate and first and second L-shaped panels extending perpendicularly from upper and lower edges, respectively, of the second elongate plate and defining a second slide chute; and
a third slide rail slidably disposed in the second slide chute, the third slide rail configured to be affixed at an end thereof to a second mounting post of the cabinet proximate a second side of the cabinet such that the slide rail assembly is fixed between the first and second posts, wherein the third slide rail comprises a third elongate web plate having a first protrusion which forms a tight fit with an inner side surface of the first slide rail in a retracted condition of the slide rail assembly.

8. The assembly of claim 7, wherein the first elongate plate has a protrusion therein configured to extend into the recess of the second elongate plate and to engage an end of the recess to provide a stop for movement of the second rail in the first slide chute.

9. The assembly of claim 7, wherein the first slide rail comprises a tab at an end thereof configured to be attached to the first mounting post and wherein the third slide rail comprises a tab at an end thereof configured to be attached to the second mounting post.

* * * * *